(12) United States Patent
Hsu et al.

(10) Patent No.: US 6,555,467 B2
(45) Date of Patent: Apr. 29, 2003

(54) METHOD OF MAKING AIR GAPS COPPER INTERCONNECT

(75) Inventors: Sheng Teng Hsu, Camas, WA (US); Wei Pan, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/967,594

(22) Filed: Sep. 28, 2001

(65) Prior Publication Data

US 2003/0064577 A1 Apr. 3, 2003

(51) Int. Cl.⁷ .......................... H01L 29/51; H01L 21/28
(52) U.S. Cl. ........................ 438/633; 438/638
(58) Field of Search .................. 438/629, 633, 438/638, FOR 355

(56) References Cited

U.S. PATENT DOCUMENTS

| | | | | |
|---|---|---|---|---|
| 6,057,224 A | * | 5/2000 | Bothra et al. | 438/619 |
| 6,413,852 B1 | * | 7/2002 | Grill et al. | 438/619 |
| 6,423,629 B1 | * | 7/2002 | Ahn et al. | 438/622 |
| 2001/0014526 A1 | * | 8/2001 | Clevenger et al. | 438/619 |

OTHER PUBLICATIONS

Georgia Tech Microelectronics Research Center Cleanroom Information, Chemical Index and MSDS Database, http://grover.mirc.gatech.edu/data/msds/index.phtml?type=polymer (Dec. 15, 2002).*

Article entitled, "NURA: A Feasible, Gas–Dielectric Interconnect Process", by Anand et al., published in VLSI Symposium, Technical Digest, p. 82, 1996.

Article entitled, "Use of Gas as Low–k Interlayer Dielectric in LSI's: Demonstration of Feasibility", by M. B. Anand et al., published in IEEE ED–44, #11, p. 1965, 1997.

Article entitled, "Air–Gaps in 0.3μm Electrical Interconnections", published in IEEE–EDL–21, #12, p. 557, Dec. 2000.

* cited by examiner

*Primary Examiner*—George Fourson
(74) *Attorney, Agent, or Firm*—Matthew D. Rabdau; David C. Ripma; Scott C. Krieger

(57) ABSTRACT

An inter-level insulator structure is provided having an effective insulator dielectric constant approaching 1. An embodiment of the inter-level insulator comprises a first metal layer comprising a first plurality of metal lines; a second metal layer comprising a second plurality of metal lines, and at least one via connected to the first metal layer; and an air gap interposed between the first metal layer and the second metal layer. In one embodiment, the air gap is also present between metal lines on either metal layer, such that air gaps act as intra-level as well as inter-level insulators. A method is also provided to deposit and pattern a sacrificial polymer, and form metal layers. The sacrificial polymer is capable of being decomposed to become air gaps during annealing.

12 Claims, 4 Drawing Sheets

US 6,555,467 B2

METHOD OF MAKING AIR GAPS COPPER INTERCONNECT

BACKGROUND OF THE INVENTION

This invention relates to inter-level isolation of interconnects in semiconductor devices and more particularly to integration processes for producing very low-k isolation of copper interconnects.

Copper interconnects are formed using a dual damascene process. The incorporation of low-k insulator material may be accomplished by depositing a first layer of low-k dielectric material over a copper interconnect. This may be followed by an optional etch stop barrier insulator and then a second layer of low-k material. A via is then etched through the second layer of low-k material, any etch stop barrier insulator, and the first layer of low-k dielectric material to reach the copper interconnect. A trench is then etched into the second layer of low-k material to aid in forming another layer of copper interconnects. Barrier metal and copper are deposited by sputtering, chemical vapor deposition (CVD), electrochemical deposition, or a combination of these methods. The deposited copper, and possibly the barrier metal, will then be planarized using chemical mechanical polishing (CMP) to form copper interconnects.

Air gaps have been used for intra-level insulators for copper, while using silicon oxide at the inter-level copper layers. The air gaps are formed by decomposing Unity™ sacrificial polymer. However, copper is in direct contact with oxide, which may result in copper diffusion into the oxide causing leakage current flow between adjacent copper lines.

SUMMARY OF THE INVENTION

Accordingly, a method of fabricating copper interconnects to integrate air gaps as inter-level insulator or intra-level and inter-level insulators is provided. A method is provided to deposit and pattern a sacrificial polymer, and form metal layers. The sacrificial polymer is capable of being decomposed to become air gaps during annealing. One possible candidate for use as a sacrificial polymer is a copolymer of butylnorbornene and triethoxysilyl norbornene dissolved as a 12wt % solution in mesitylene.

An inter-level insulator structure is provided having an effective insulator dielectric constant approaching 1. An embodiment of the inter-level insulator comprises a first metal layer comprising a first plurality of metal lines; a second metal layer comprising a second plurality of metal lines, and at least one via connected to the first metal layer; and an air gap interposed between the first metal layer and the second metal layer. In one embodiment, the air gap is also present between metal lines on either metal layer, such that air gaps act as intra-level as well as inter-level insulators.

DETAILED DESCRIPTION OF THE INVENTION

Figure 1:
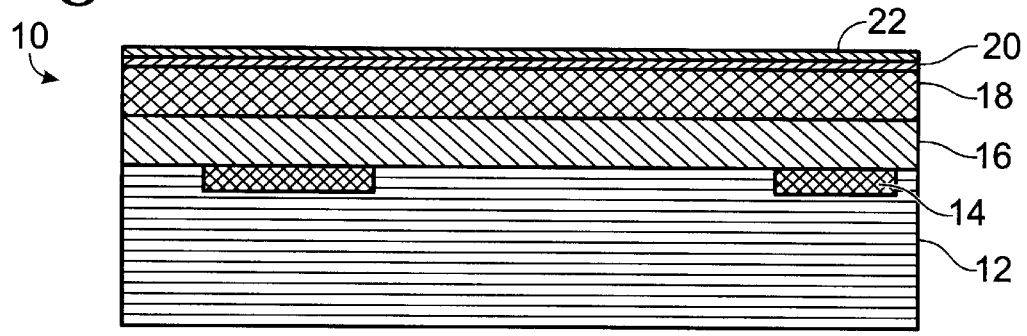
FIG. 1 is a cross sectional view of an interconnect structure following initial layer and hard mask deposition.

FIG. 1 shows an interconnect structure 10 comprising a substrate 12 with device regions 14 following front-end fabrication. In one embodiment, which is illustrated in the attached figures, oxide is used as a first insulator between the substrate 12 and metal lines to be formed overlying the first insulator. In another embodiment, another low-k material could be used instead or oxide, or Unity™ sacrificial polymer could be used as will be described for use in connection with the formation of upper insulator layers.

After front-end fabrication is complete a first insulator layer 16, which is preferably silicon dioxide, between approximately 500 nm and 1000 nm thick, is deposited over the substrate and CMP planarized to form the dielectric layer between the substrate 12 and a first metal line, which is yet to be formed. A first sacrificial layer 18 is spin coated to a thickness of approximately between 500 nm to 800 nm. In one embodiment, the first sacrificial layer 18 comprises Unity™ sacrificial polymer. The Unity™ sacrificial polymer is available from BFGoodrich, Cleveland, Ohio. It is a copolymer of butylnorbornene and triethoxysilyl norbornene. The Unity™ sacrificial polymer was dissolved as a 6–12wt % solution in mesitylene for spin coating application. The first sacrificial layer 18 is Unity™ sacrificial polymer, it is preferably soft baked at between approximately 95° C. and 120° C. for approximately three to five minutes. The soft bake is followed by a curing process. The Unity™ sacrificial polymer are preferably cured under vacuum or nitrogen ambient at between approximately 200° C. and 250° C. for approximately one to two hours. A nitride hard mask 20, between approximately 20 nm and 50 nm, is deposited followed by the deposition of an oxide hard mask 22, between approximately 20 nm and 50 nm, to form a double hard mask atop the first sacrificial layer 18 for self-aligned Via formation. This is shown in FIG.1. Alternatively, the oxide hard mask 22 could be formed first with an overlying nitride hard mask 20 formed thereon although the etch sequence may need to be modified slightly.

A first layer of photoresist is deposited over the oxide hard mask 22 and patterned. The oxide hard mask is etched to form a via opening in the oxide hard mask. For ease of description, a single via opening is discussed although a plurality of via openings may be formed simultaneously, as shown in the attached figures.

A second layer of photoresist is deposited and patterned to form a trench mask. The nitride hard mask 20 is etched at the via opening formed in the oxide hard mask 22 to form a nitride via opening 24. The oxide hard mask is then etched to form a trench opening 26. The resist may be stripped, as shown in FIG. 2, prior to etching vias and trenches, or it may be left intact and stripped after etching.

Figure 2:
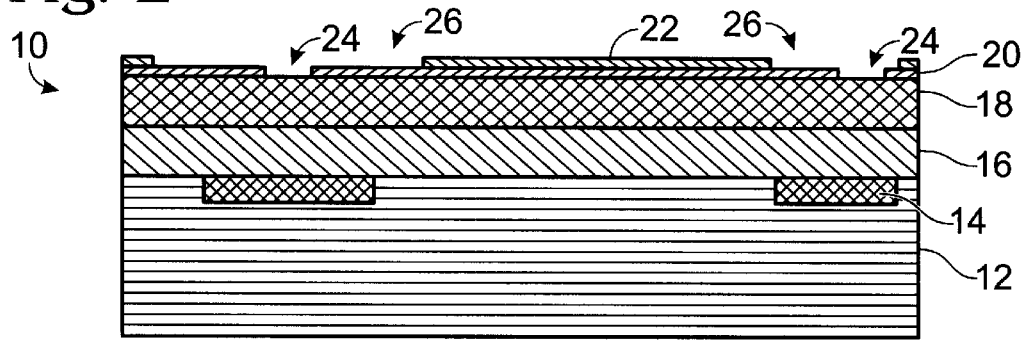
FIG. 2 is a cross sectional view of the interconnect structure following masking steps.
Figure 3:
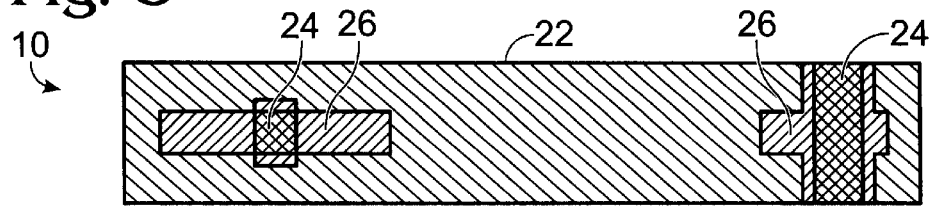
FIG. 3 is a planar view showing the top of a dual hard mask.

FIG. 3 shows the planar view of the top of the hard masks following patterning, corresponding to the cross-sectional view of FIG. 2. The via opening 24 may be oversized in the direction of the trench width, as shown.

Figure 4:
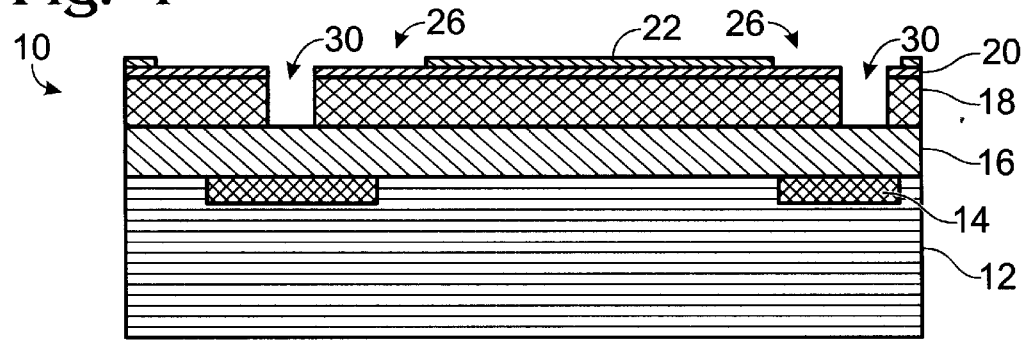
FIG. 4 is a cross sectional view following formation of a partial via.

Referring now to FIG. 4, the first sacrificial layer 18 is etched to form a via 30 where the first sacrificial layer 18 is not protected by either the oxide hard mask 22 or nitride hard mask 20. The method of etching the first sacrificial layer 18 will depend upon the material chosen for the first sacrificial layer. If Unity™ sacrificial polymer is used for the first sacrificial layer it can be etched using a dry etch process, for example an oxygen plasma etch, or other suitable etch process.

Figure 5:
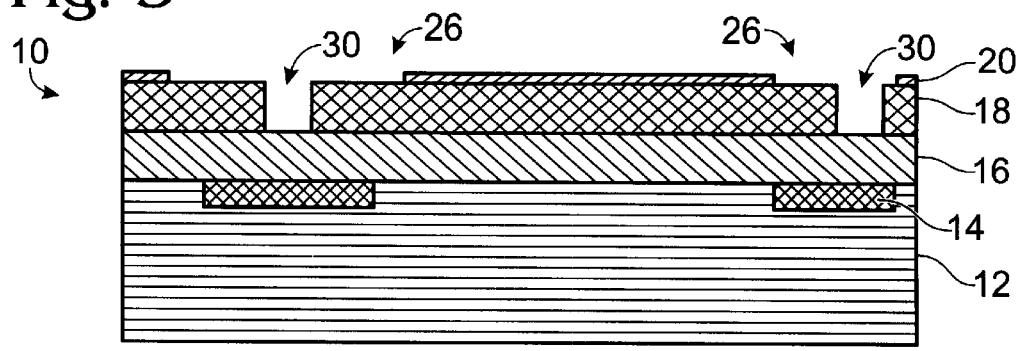
FIG. 5 is a cross sectional view following formation of a nitride trench mask.
Figure 6:
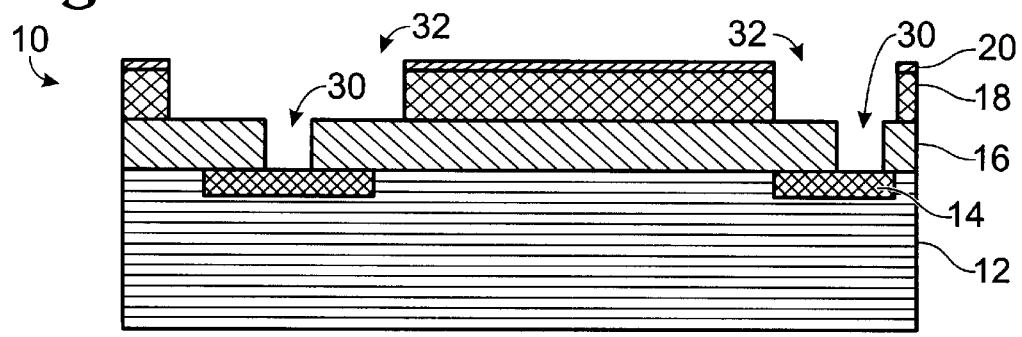
FIG. 6 is a cross sectional view following formation of a trench and via.

Referring now to FIG. 5, in one embodiment, the nitride hard mask 20 is selectively etched using the oxide hard mask 22 to form the trench pattern in the oxide. In one embodiment, the oxide hard mask is removed after the nitride hard mask 20 has been etched, as shown. Alternatively, the oxide hard mask 22 could be left intact, and removed during subsequent etch processes. Referring now to FIG. 6, the nitride hard mask 20 is used to etch the first sacrificial layer 18 to form a trench 32. The first insulator layer 16 is etched extending the via 30 until it reaches the device regions 14. In another embodiment, the first sacrificial layer 18 acts as a mask while the silicon dioxide is etched, for example a plasma contain $C_3F_8$ and Argon could be used. Other etch chemistries are also available to etch silicon dioxide without etching the first sacrificial layer. Then the first sacrificial layer 18 is selectively etched, preferably using a plasma comprising oxygen if Unity™ sacrificial polymer is used as the first sacrificial layer, to form the trench 32. Regardless of the etch sequence or process used, the resulting structure is shown in FIG. 6, wherein trenches and vias have been formed.

Figure 7:
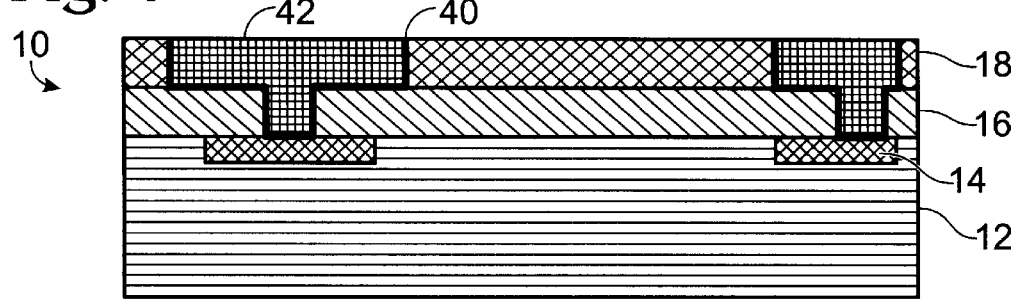
FIG. 7 is a cross sectional view following deposition of barrier metal and interconnects.

Referring now to FIG. 7, barrier metal 40 and copper 42 are deposited and CMP planarized. In one embodiment, the nitride hard mask 20 is also removed.

In another embodiment, the first insulator layer is also a sacrificial layer, of for example Unity™ sacrificial polymer. A thin layer of oxide is deposited and CMP planarized. An initial sacrificial layer is then deposited. Alternatively, after front-end processing a layer of silicon dioxide between approximately 50 nm and 200 nm is deposited, followed by deposition and CMP planarization of the initial sacrificial layer. A placeholder oxide layer is deposited with a first intra-level sacrificial layer. In one embodiment, following barrier metal and copper deposition, the initial sacrificial layer is interposed between the first copper level and the substrate. Following completion of processing, this will produce an air gap between the first copper level and the substrate.

Figure 8:
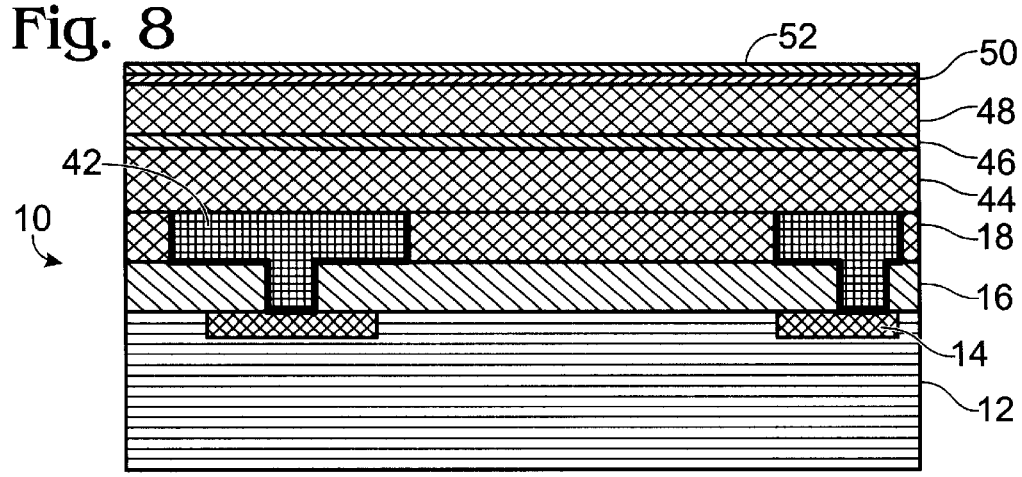
FIG. 8 is a cross sectional view following deposition of layers for forming an additional interconnect layer.

Referring now to FIG. 8, a second sacrificial layer 44 is deposited to a thickness between approximately 500 nm and 1500 nm. In one embodiment, the second sacrificial layer is Unity™ sacrificial polymer, which is deposited by spin coating. An etch stop layer 46 is deposited over the second sacrificial layer to a thickness of between approximately 50 nm and 100 nm. The etch stop material is preferably silicon dioxide. A third sacrificial layer 48, preferably of the same material as the other sacrificial layers although not necessarily the same material, is deposited to a thickness of between approximately 500 nm and 800 nm. If Unity™ sacrificial polymer is used, the interlevel structure 10 is preferably heated to approximately 120° C. for approximately 3 minutes to soft cure the Unity™ sacrificial polymer. A double hard mask is then formed overlying the third sacrificial layer 48. In one embodiment, a second nitride hard mask 50 is deposited to a thickness of between approximately 20 nm and 50 nm, followed by a second oxide hard mask 52, which is deposited to a thickness of between approximately 20 nm and 50 nm.

As discussed above, a third layer of photoresist is deposited over the oxide hard mask 52 and patterned. The oxide hard mask is etched to form a via opening in the oxide hard mask. For ease of description, a single via opening is discussed although a plurality of via openings may be formed simultaneously, as shown in the attached figures.

A forth layer of photoresist is deposited and patterned to form a trench mask. The nitride hard mask 50 is etched at the via opening formed in the oxide hard mask 52 to form a nitride via opening. The oxide hard mask is then etched to form a trench opening.

Figure 9:
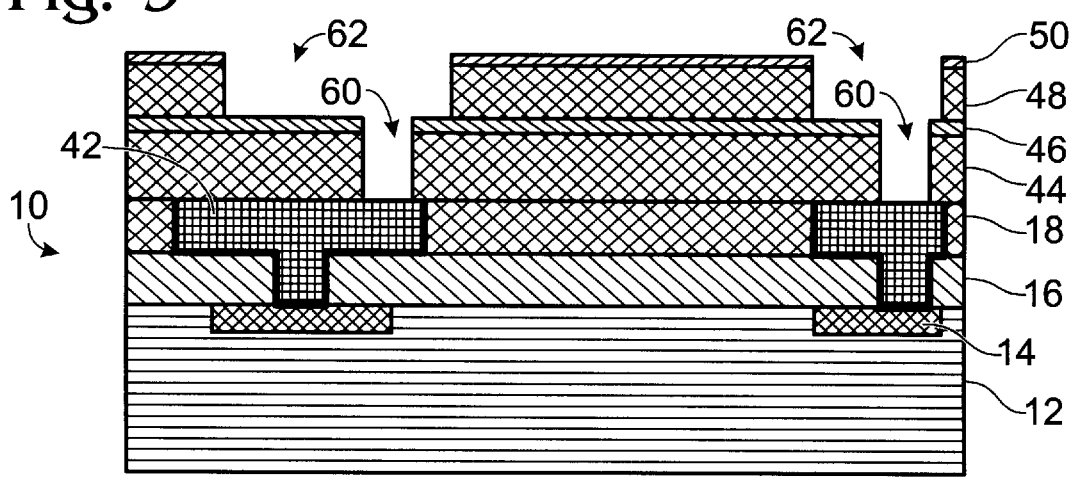
FIG. 9 is a cross sectional view following formation of an additional trench and via.

The third sacrificial layer 48 is etched to form a partial via 57. In one embodiment, the second hard oxide mask is removed along with the exposed portion of the etch stop layer 46 to form a via opening in the etch stop layer 46. The second nitride hard mask and the etch stop act as masks, while the second sacrificial layer is etched to form a second-level via 60 and the third sacrificial layer is etched to form a second-level trench 62. FIG. 9 shows the interconnect structure 10 following the formation of the second layer of vias and trenches.

In another embodiment, the second oxide hard mask is deposited prior to the second nitride hard mask. In this case the third layer of photoresist is deposited over the second nitride hard mask and patterned to allow a via opening to be etched in the second oxide hard mask. A via opening is then etched in the oxide hard mask. A fourth layer of photoresist is deposited and a trench mask is patterned into the second nitride hard mask. The third sacrificial layer 48 is then etched down to the etch stop layer 46. The second nitride hard mask is then removed. Followed by removal of the second oxide hard mask and a portion of the etch stop exposed below the via opening. The third sacrificial layer and the second sacrificial layer are then etched to form the via and trench structure shown in FIG. 9.

Figure 10:
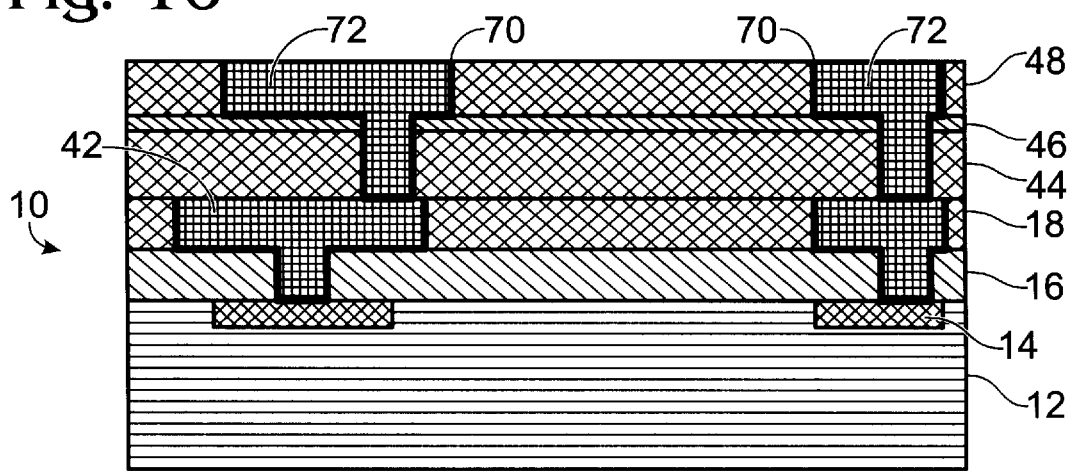
FIG. 10 is a cross sectional view following deposition of barrier metal and interconnects.

Referring now to FIG. 10, barrier metal 70 and copper 72 are deposited and CMP planarized. In one embodiment, the second nitride hard mask is also removed.

Figure 11:
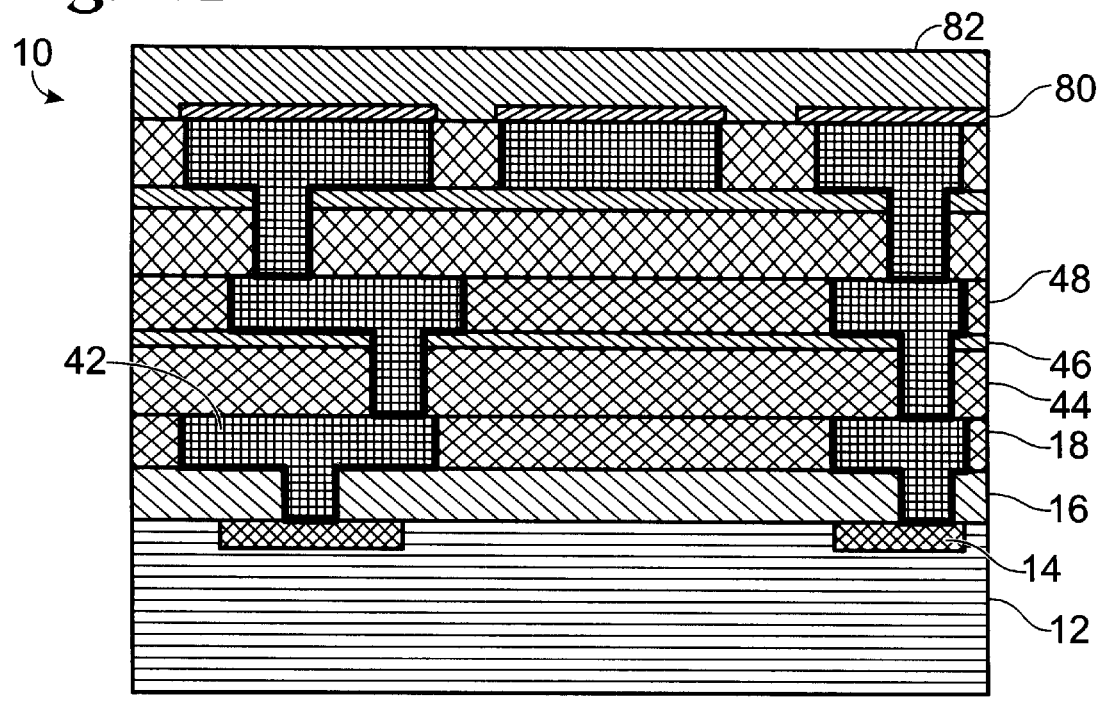
FIG. 11 is a cross sectional view showing three interconnect levels following passivation.

Repeating the steps of depositing additional sacrificial layers, etch stops, and hard masks, followed by patterning and selective etching as described above can be used to form additional interconnect levels. As shown in FIG. 11, a total of three interconnect levels have been formed. Additional levels are also possible, by repeating the process. Once the final interconnect level is completed, a capping layer 80 of silicon nitride or boron nitride is deposited to a thickness of approximately between 5 nm and 10 nm and patterned, preferably using photoresist, to protect the top copper layer. This capping layer is preferably slightly larger than the trench of the top metal lines, but it is not very dimensionally critical. Any remaining photoresist is then stripped. A passivation layer 82, preferably of oxide, is deposited to a thickness of between approximately 500 nm and 1500 nm.

Figure 12:
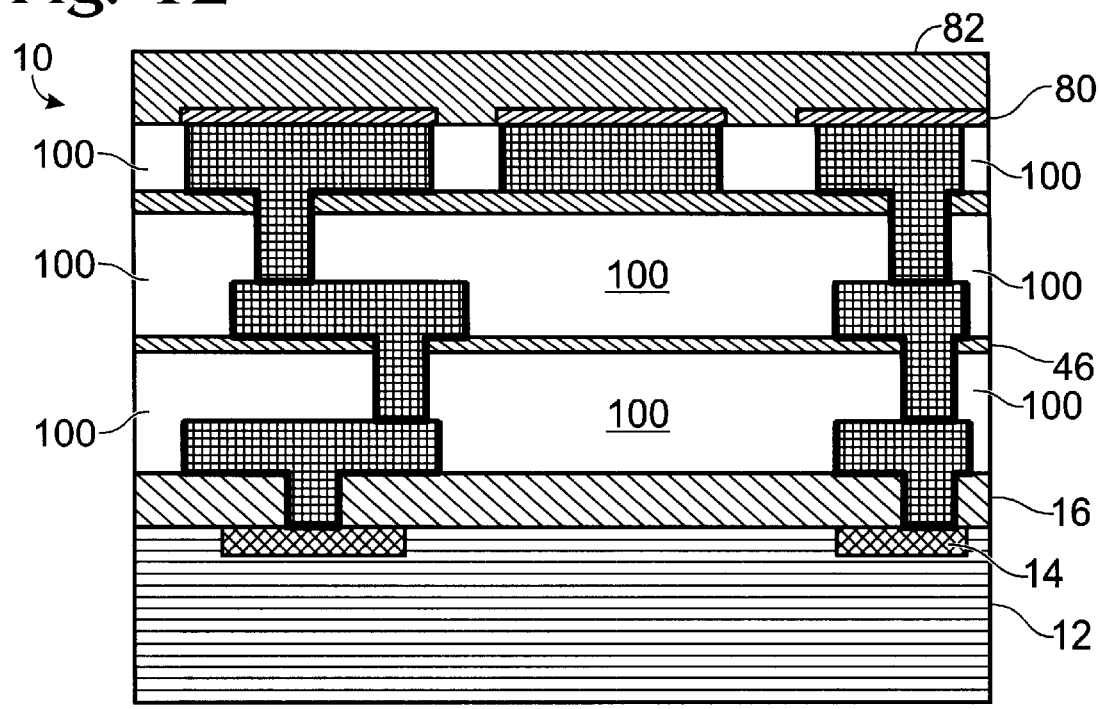
FIG. 12 is a cross sectional view following decomposition of any sacrificial layers to form air gaps between interconnects.

Referring now to FIG. 12, all of the sacrificial layers are decomposed to produce the interconnect structure 10 having air gaps 100 which serve as intra-level insulators and inter-level insulators. In the embodiment where Unity™ sacrificial polymer is used, the interconnect structure 10 is preferably annealed in a nitrogen purged furnace at a temperature between approximately 425° C. and 500° C. to decompose the Unity™ sacrificial polymer and allow it to permeate through any overlying oxide.

Following processing as described above, air gaps are formed as both inter-level insulators and intra-level insulators, therefore, the effective dielectric constant shall be very close to 1 when the etch stop/placeholder silicon oxide is very thin. For an integrated circuit with very large number of interconnect layers the thickness of the etch stop/placeholder oxide may have to be increase to enhance the mechanical strength. This will increase the effective dielectric constant of the system. The surface of the top layer copper is protected with nitride. There is no direct silicon oxide to copper contact. Therefore, there is no copper diffusion problem. The leakage current between adjacent copper lines and that between copper layers is expected to be very small. The illustration sketches showed two stacks of contact. The left-hand side intended to be a normal interconnects. The right hand side stack is to illustrate the edge shielding which is need for mechanical support of the etch stop/placeholder oxide layer and copper lines. In one embodiment, the edge shielding is distributed around the perimeter of the device to provide additional mechanical support. In another embodiment, the edge shielding is also provided at key points throughout the chip area. The edge shielding can be used as one of the power supply bus lines or ground lines.

The etch stop/placeholder silicon oxide is adhered to the metal lines through the barrier metal. Therefore, the good adhesion between barrier metal and copper and barrier metal to etch stop/placeholder oxide is preferred. The preferred barrier metals for this application are Ti or TiN.

Although preferred embodiments along with some alternatives have been described, the invention is not limited to any specific embodiment. Rather, the scope of the invention is determined by the following claims and their equivalents.

What is claimed is:

1. A method of forming an inter-level insulator structure comprising the steps of:
    a) providing a first metal layer overlying a substrate;
    b) depositing a first sacrificial layer overlying the first metal layer;
    c) depositing an etch stop overlying the first metal layer;
    d) depositing a second sacrificial layer overlying the etch stop;
    e) forming a double layer hard mask overlying the second sacrificial layer;
    f) patterning the double layer hard mask to produce a via mask and a trench mask;
    g) etching the second sacrificial layer to form a partial via down to the etch stop;
    h) etching an exposed portion of the etch stop;
    i) etching the first sacrificial layer to form a via, whereby the first metal layer is exposed;
    j) etching the second sacrificial layer to form a trench;
    k) depositing a barrier metal and copper;
    l) planarizing the barrier metal and copper to form a second metal layer; and
    m) decomposing the first and second sacrificial layer, whereby the first sacrificial layer and the second sacrificial layer are replaced by air gaps.

2. The method of claim 1, wherein the first metal layer comprises copper.

3. The method of claim 1, wherein the double layer hard mask comprises a layer of silicon dioxide followed by a layer of silicon nitride.

4. The method of claim 1, wherein the double layer hard mask comprises a layer of silicon nitride followed by a layer of silicon dioxide.

5. The method of claim 1, wherein the step of depositing the first sacrificial layer further comprises spin coating.

6. The method of claim 1, wherein the first sacrificial layer comprises a sacrificial polymer.

7. The method of claim 6, wherein the sacrificial polymer comprises a copolymer of butylnorbornene and triethoxysilyl norbornene.

8. The method of claim 6, wherein the sacrificial polymer comprises a copolymer of butylnorbornene and triethoxysilyl norbornene dissolved as a 6–12 wt % solution in mesitylene.

9. The method of claim 6, wherein the sacrificial polymer comprises a mixture of mesitylene and polyolefin.

10. The method of claim 6, wherein the sacrificial polymer comprises polyolefin dissolved as a 6–12 wt % solution in mesitylene.

11. The method of claim 1, wherein the etch stop comprises silicon dioxide.

12. The method of claim 1, wherein the second sacrificial layer comprises a sacrificial polymer.

* * * * *